(12) United States Patent
Nogami (10) Patent No.: US 8,193,566 B2
(45) Date of Patent: Jun. 5, 2012

(54) SEMICONDUCTOR DEVICE

(75) Inventor: Yoichi Nogami, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/238,038

(22) Filed: Sep. 21, 2011

(65) Prior Publication Data
US 2012/0007153 A1    Jan. 12, 2012

Related U.S. Application Data

(62) Division of application No. 11/927,776, filed on Oct. 30, 2007, now Pat. No. 8,039,871.

(30) Foreign Application Priority Data

May 17, 2007    (JP) .................................. 2007-131467

(51) Int. Cl.
*H01L 29/812*    (2006.01)
(52) U.S. Cl. ........ 257/280; 257/192; 257/193; 257/194; 257/292; 257/615; 257/E29.246
(58) Field of Classification Search .................. 257/280, 257/192–194, 292, 615, E29.246
See application file for complete search history.

(56) References Cited

U.S. PATENT DOCUMENTS
2007/0045670 A1    3/2007    Kuraguchi

FOREIGN PATENT DOCUMENTS
| JP | 5-235054 A | 9/1993 |
|---|---|---|
| JP | 6-188273 A | 7/1994 |
| JP | 9-092818 A | 4/1997 |

OTHER PUBLICATIONS

Minasian, R. A.,"Intermodulation Distortion Analysis of MESFET Amplifiers Using the Volterra Series Representation", *IEEE Transactions on Microwave Theory and Techniques*, Mtt-28(1):1-8 (1980).
Pucel, R. A., "Profile Design for Distortion Reduction in Microwave Field-Effect Transistors" *Electronics Letters*, 14(6):204-206 (1978).
Inoue, K., et al., "A High Gain L-band GaAs FET Technology for 28V Operation" *IEEE MTS-S Digest*, pp. 821-824 (2004).

*Primary Examiner* — Cuong Q Nguyen
*Assistant Examiner* — Tran Tran
(74) *Attorney, Agent, or Firm* — Leydig, Voit & Mayer, Ltd.

(57) ABSTRACT

A semiconductor device includes: a compound semiconductor substrate; a buffer layer, a channel layer, and a Schottky junction forming layer sequentially disposed on the compound semiconductor substrate, the buffer layer, the channel layer, and the Schottky junction forming layer each being compound semiconductor materials; a source electrode and a drain electrode located on the Schottky junction forming layer; and a gate electrode disposed between the source and drain electrodes and forming a Schottky junction with the Schottky junction forming layer. The dopant impurity concentration in the channel layer is inversely proportional to the third power of depth into the channel layer from a top surface of the channel layer. The gate electrode has a gate length in a range from 0.2 μm to 0.6 μm.

1 Claim, 6 Drawing Sheets

SEMICONDUCTOR DEVICE

BACKGROUND OF THE INVENTION

1. Field of the Invention

The present invention relates to semiconductor devices having improved distortion characteristics.

2. Background Art

The trend toward digitization of communications systems has created a great need to improve the distortion characteristics of the semiconductor devices in the output stage of communication devices, as well as to reduce the size and increase the output power and efficiency of these semiconductor devices.

When two signals of different frequencies f1 and f2 (fundamental frequencies) are input to a semiconductor device, second harmonics having frequencies of f1×2 and f2×2 are typically generated and mixed with the fundamental frequencies, forming additional signals, or distortion components, at frequencies of 2×f1−f2 and 2×f2−f1, which are very close to the fundamental frequencies. This type of intermodulation distortion is referred to as "third order intermodulation distortion," or "IMD3," and caused by nonlinear characteristics of the semiconductor device. Such intermodulation distortion may cause noise between adjacent lines. To prevent this, a communications system employing a plurality of communication lines (or frequency multiplex communication) requires semiconductor devices having low distortion characteristics.

The relationship between the distortion characteristics of a semiconductor device and electrical parameters thereof may be analyzed using Volterra series representation. (See, e.g., R. A. Minasian, IEEE Trans. Microwave Theory Tech., vol. 28, No. 1, pp. 1-8, 1980.) A Volterra series expansion for determining the IMD3 indicates that increasing the transconductance gm of the semiconductor device or reducing its second derivative gm" (with respect to the bias voltage) may be effective in improving the distortion characteristics of the semiconductor device.

An effective way (theoretically proven) to reduce the second derivative (gm") of the transconductance is to establish a doping profile in the channel layer of the semiconductor device such that the dopant impurity concentration varies inversely with the third power of depth, x, measured into the layer from the surface (that is, the dopant impurity concentration is proportional to $x^{-3}$). (See, e.g., R. A. Pucel, Electronics Lett., vol. 14, No. 6, pp. 204-206, 1978.) We fabricated such a semiconductor device and investigated its distortion characteristics, as described below.

Figure 9:
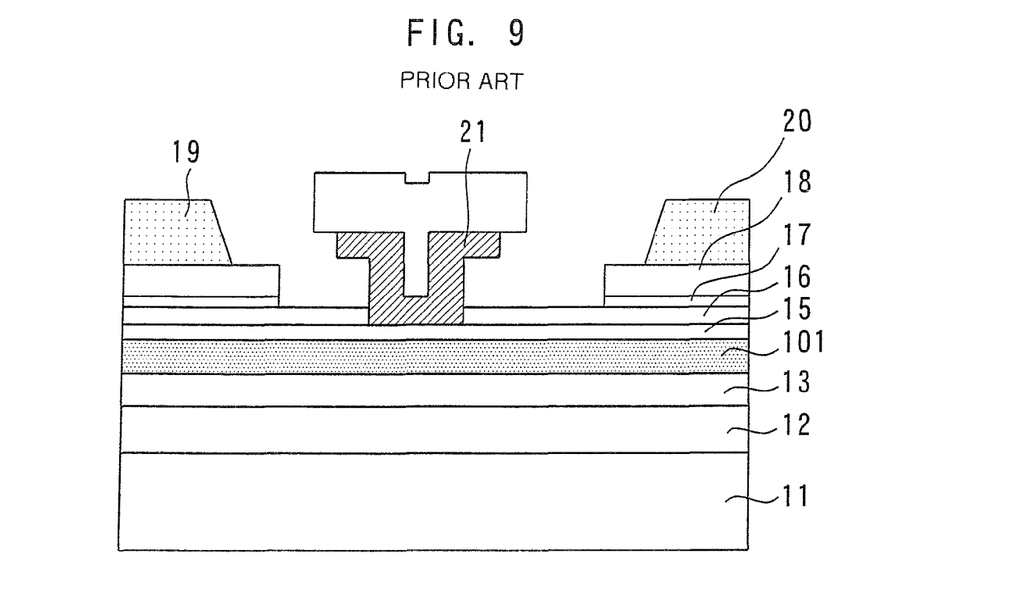
FIG. 9 is a cross-sectional view of a conventional semiconductor device.

FIG. 9 is a cross-sectional view of a conventional semiconductor device. Referring to FIG. 9, the following layers are sequentially formed on top of one another on a semi-insulating GaAs substrate 11: an undoped AlGaAs/undoped GaAs superlattice buffer layer 12, an undoped GaAs buffer layer 13, an n-type GaAs channel layer 101, an n-type AlGaAs Schottky junction forming layer 15, an n-type GaAs lower contact layer 16, an n-type AlGaAs etch stopper layer 17, and an $n^+$-type GaAs upper contact layer 18.

A source electrode 19 and a drain electrode 20 are formed on the $n^+$-type GaAs upper contact layer 18. A recess structure is formed through the n-type AlGaAs etch stopper layer 17 and the $n^+$-type GaAs upper contact layer 18. A gate electrode 21 is disposed within the recess structure between the source electrode 19 and the drain electrode 20 and forms a Schottky junction with the n-type AlGaAs Schottky junction forming layer 15.

The n-type GaAs channel layer 101 has a graded doping profile such that the dopant impurity concentration varies inversely with the third power of depth, x, measured into the layer from the surface (that is, the dopant impurity concentration is proportional to $x^{-3}$). The n-type GaAs channel layer 101 has a thickness of 1800 Å, and its top surface has a dopant impurity concentration of $2.3 \times 10^{17}$ cm$^{-3}$.

Figure 10:
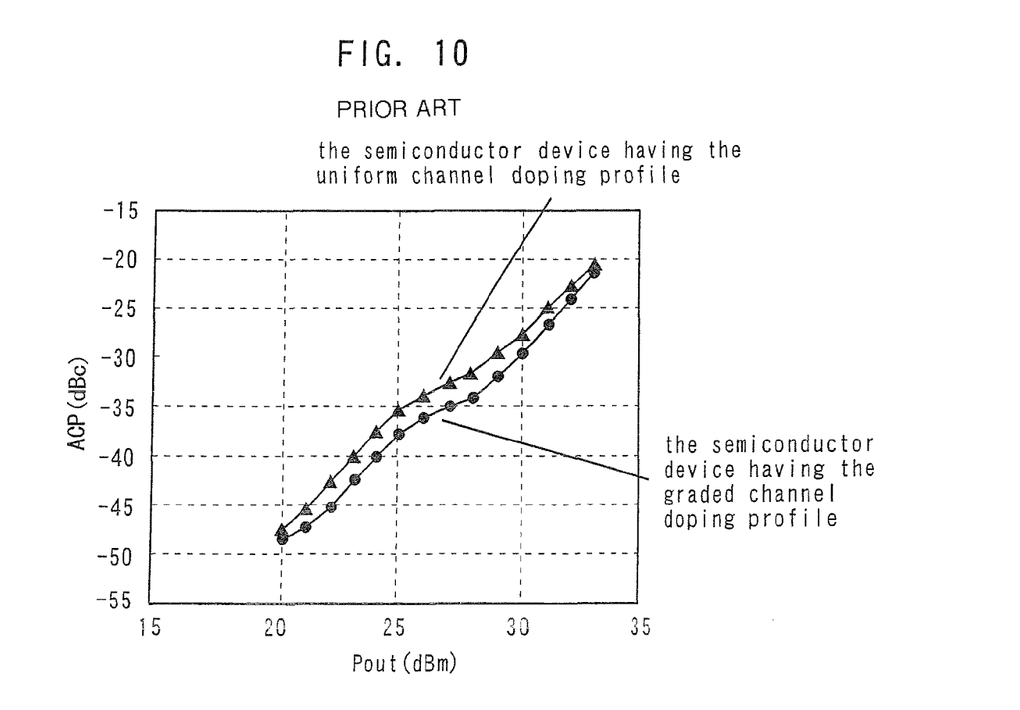
FIG. 10 is a diagram showing measured distortion characteristics of this conventional semiconductor device.

FIG. 10 is a diagram showing measured distortion characteristics (namely, adjacent channel power, or ACP) of this conventional semiconductor device. FIG. 10 also shows, for comparison, measured distortion characteristics (or adjacent channel power) of a widely used semiconductor device in which the channel layer has a uniform dopant impurity concentration as a function of depth. The channel layer of the comparative semiconductor device is made of n-type GaAs and has a dopant impurity concentration of $1.5 \times 10^{17}$ cm$^{-3}$ and a thickness of 1300 Å. That is, this channel layer has substantially the same sheet dopant impurity concentration and the same pinch-off voltage as the channel layer of the semiconductor device described above and having the graded channel doping profile.

These semiconductor devices have a gate length Lg of 1.1 μm and a gate width Wg of 12.6 mm. They were each mounted in a surface mount discrete package. The distortion characteristics of each semiconductor device were measured when a 2.14 GHz W-CDMA modulated signal (3GPP TEST MODEL 1, 64 code single signal, 3.84 MHz channel bandwidth) was input to the device with the drain voltage Vd and the drain current Id set to 10 V and 300 mA.

The measurement results clearly show that the semiconductor device having the graded channel doping profile has lower distortion characteristics than the comparative semiconductor device having the uniform channel doping profile.

Figure 11:
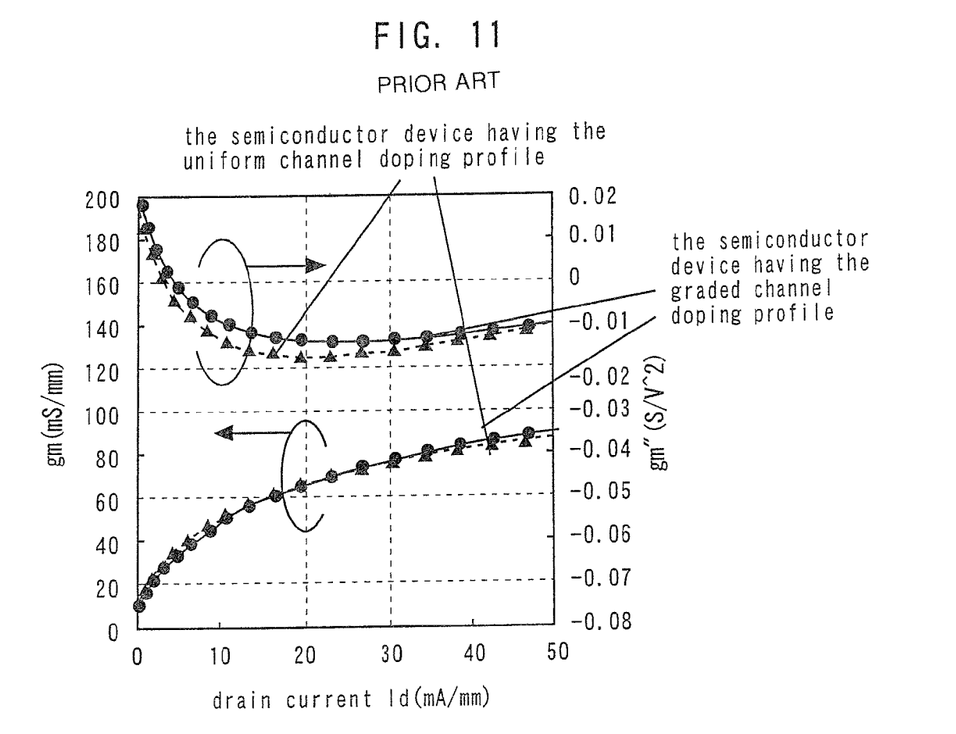
FIG. 11 shows measured relationships between the drain current Id and the transconductance gm of the semiconductor device having the graded channel doping profile and between the drain current Id and the second derivative gm" of the transconductance.

FIG. 11 shows measured relationships between the drain current Id and the transconductance gm of the semiconductor device having the graded channel doping profile and between the drain current Id and the second derivative gm" of the transconductance gm (with respect to the gate bias). FIG. 11 also shows the same relationships for the comparative semiconductor device having the uniform channel doping profile.

As shown in FIG. 11, these semiconductor devices have substantially the same transconductance (gm). However, the transconductance gm of the semiconductor device having the graded channel doping profile has a smaller second derivative (with respect to the gate bias) than that of the comparative semiconductor device having the uniform channel doping profile. From this, it may be concluded that the improved distortion characteristics of the semiconductor device having the graded channel doping profile results from the fact that its transconductance gm has a reduced second derivative gm" (with respect to the gate bias).

However, generally the characteristics of a field-effect semiconductor device tend to be affected by its surface state, as well as by the state of its buffer layer side. This means that it is difficult to achieve ideal transconductance characteristics (that is, transconductance characteristics whose second derivative gm" with respect to the gate bias is zero) by the creation of the above channel doping profile alone.

SUMMARY OF THE INVENTION

The present invention has been devised to solve the above problems. It is, therefore, an object of the present invention to provide a semiconductor device having improved distortion characteristics.

According to one aspect of the present invention, a semiconductor device comprises: a compound semiconductor substrate; a buffer layer, a channel layer, and a Schottky junction forming layer sequentially formed on top of one another on said compound semiconductor substrate, said buffer layer, said channel layer, and said Schottky junction forming layer being made of a compound semiconductor; a source electrode and a drain electrode each formed on said Schottky junction forming layer; and a gate electrode disposed between said source and drain electrodes and forming a Schottky junction with said Schottky junction forming layer; wherein the carrier density in said channel layer is inversely proportional to the third power of depth into said channel layer from a top surface thereof; wherein said channel layer has a uniform sheet carrier density; and wherein said top surface of said channel layer has a doping density of $5.0\times10^{17}$ cm$^{-3}$-$2.0\times10^{18}$ cm$^{-3}$.

Thus, the present invention provides a semiconductor device having improved distortion characteristics.

Other and further objects, features and advantages of the invention will appear more fully from the following description.

DETAILED DESCRIPTION OF THE PREFERRED EMBODIMENTS

First Embodiment

Figure 1:
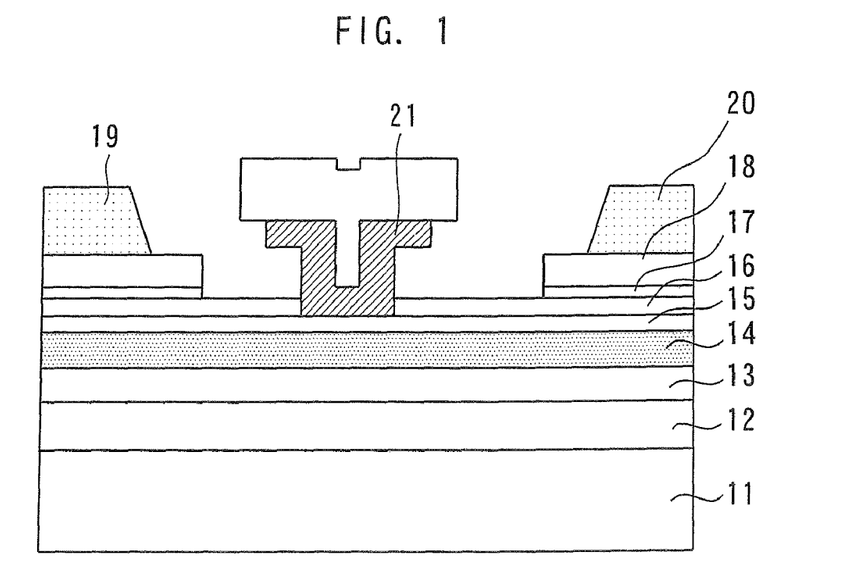
FIG. 1 is a cross-sectional view of a semiconductor device according to a first embodiment of the present invention.

FIG. 1 is a cross-sectional view of a semiconductor device according to a first embodiment of the present invention. Referring to FIG. 1, the following layers are sequentially formed on top of one another on a semi-insulating GaAs substrate 11 (referred to as a "compound semiconductor substrate" in the appended claims): an undoped AlGaAs/undoped GaAs superlattice buffer layer 12; an undoped GaAs buffer layer 13 (referred to simply as a "buffer layer" in the appended claims); an n-type GaAs channel layer 14 (referred to simply as a "channel layer" in the appended claims); an n-type AlGaAs Schottky junction forming layer 15 (referred to simply as a "Schottky junction forming layer" in the appended claims); an n-type GaAs lower contact layer 16, an n-type AlGaAs etch stopper layer 17; and an n$^+$-type GaAs upper contact layer 18.

A source electrode 19 and a drain electrode 20 are formed on the n$^+$-type GaAs upper contact layer 18 (i.e., above the n-type AlGaAs Schottky junction forming layer 15). A recess structure is formed through the n-type AlGaAs etch stopper layer 17 and the n$^+$-type GaAs upper contact layer 18. A gate electrode 21 is disposed within the recess structure between the source electrode 19 and the drain electrode 20 and forms a Schottky junction with the n-type AlGaAs Schottky junction forming layer 15. The gate length Lg of the gate electrode 21 is 0.5 μm-1.1 μm.

Figure 2:
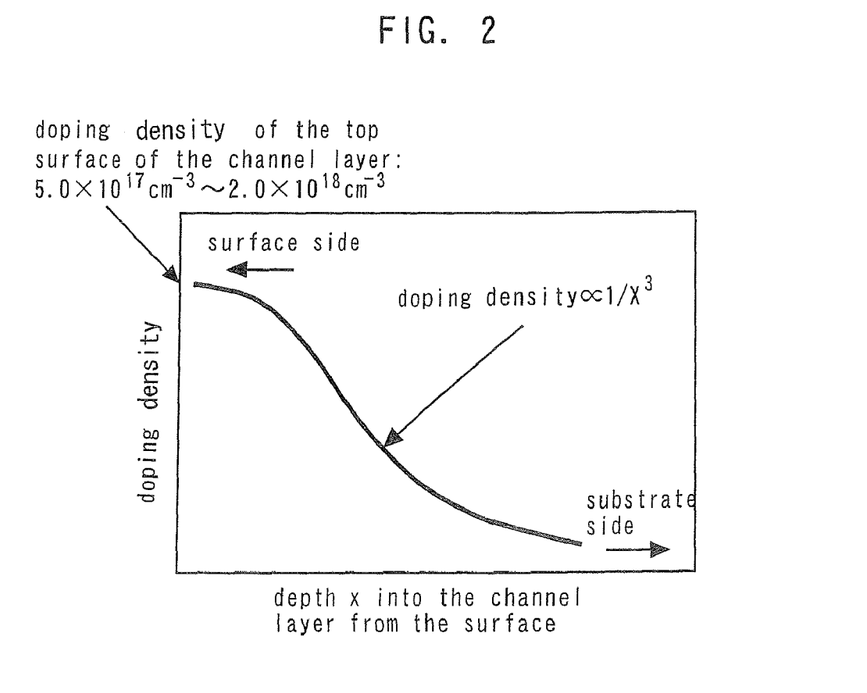
FIG. 2 is a diagram showing the relationship between depth into the channel layer and the carrier density.

FIG. 2 is a diagram showing the relationship between depth into the channel layer and the dopant impurity concentration. As shown in FIG. 2, the n-type GaAs channel layer 14 has a graded doping profile such that the dopant impurity concentration varies inversely with the third power of depth, x, into the channel layer from the surface thereof (that is, the dopant impurity concentration is proportional to x$^{-3}$). Further, the n-type GaAs channel layer 14 has a fixed sheet dopant impurity concentration of $1.24\pm0.1\times10^{12}$ cm$^{-2}$ (measured by Hall measurement means).

According to the present embodiment, the top surface of the n-type GaAs channel layer 14 has a dopant impurity concentration of $5.0\times10^{17}$ cm$^{-3}$-$2.0\times10^{18}$ cm$^{-3}$. More specifically, when the dopant impurity concentration at the top surface of the n-type GaAs channel layer 14 is $5.0\times10^{17}$ cm$^{-3}$, the thickness of the channel layer 14 is 700 Å; when the dopant impurity concentration of the top surface is $2.0\times10^{18}$ cm$^{-3}$, the thickness of the channel layer 14 is 180 Å.

There will now be briefly described a method for manufacturing the semiconductor device according to the present embodiment. First, the following layers are sequentially formed on top of one another on the semi-insulating GaAs substrate 11 by a crystal growth technique such as MBE or MOCVD: the undoped AlGaAs/undoped GaAs superlattice buffer layer 12, the undoped GaAs buffer layer 13, the n-type GaAs channel layer 14, the n-type AlGaAs Schottky junction forming layer 15, the n-type GaAs lower contact layer 16, the n-type AlGaAs etch stopper layer 17, and the n$^+$-type GaAs upper contact layer 18. It should be noted that the n-type GaAs channel layer 14 is doped with Si to form the doping profile described above. Further, the top surface of the n-type GaAs channel layer 14 has a dopant impurity concentration of $5.0\times10^{17}$ cm$^{-3}$-$2.0\times10^{18}$ cm$^{-3}$.

The recess structure, the source electrode 19, the drain electrode 20 and the gate electrode 21 are then formed by suitable processes, completing the manufacture of the semiconductor device of the present embodiment.

Figure 3:
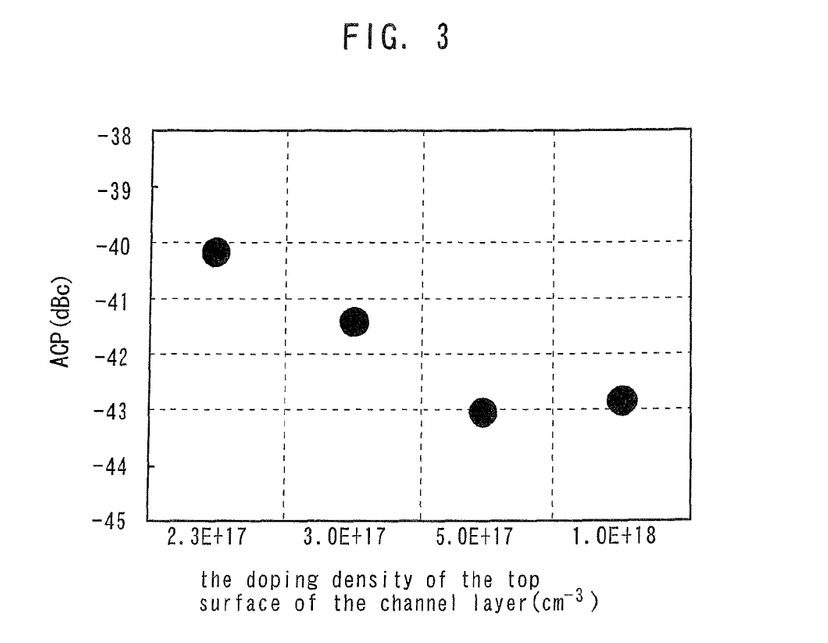
FIG. 3 is a diagram showing a measured relationship between the distortion characteristics of the semiconductor device of the first embodiment and the doping density of the top surface of its channel layer.

Characteristics of the semiconductor device of the present embodiment will now be described. FIG. 3 is a diagram showing a measured relationship between the distortion characteristics (namely, the adjacent channel power, or ACP) of the semiconductor device of the present embodiment and the dopant impurity concentration of the top surface of its channel layer. This semiconductor device has a gate length Lg of 1.1 μm and a gate width Wg of 12.6 mm. It was mounted in a surface mount discrete package. The distortion characteristics of the semiconductor device were measured when a 2.14

GHz W-CDMA modulated signal (3GPP TEST MODEL 1, 64 code single signal, 3.84 MHz channel bandwidth) was input to the device with the drain voltage Vd and the drain current Id set to 10 V and 300 mA. The output power (Pout) of the semiconductor device was 24 dBm.

The measurement results show that the distortion characteristics of the semiconductor device improved as the dopant impurity concentration at the top surface of the channel layer increased (and the thickness of the channel layer was reduced accordingly), while maintaining the graded doping impurity profile described above, until the dopant impurity concentration at the top surface of the channel layer reached $5.0 \times 10^{17}$ $cm^{-3}$, after which the distortion characteristics substantially did not change. That is, the semiconductor device has low distortion characteristics when the top surface of its channel layer has a dopant impurity concentration equal to or higher than $5.0 \times 10^{17}$ $cm^{-3}$. The dopant impurity concentration of the top surface of the channel layer may be set to $2.0 \times 10^{18}$ $cm^{-3}$ or less to increase the thickness of the channel layer so as to be able to reliably form the above dopant impurity concentration profile in the channel layer while sufficiently activating the carriers.

Figure 4:
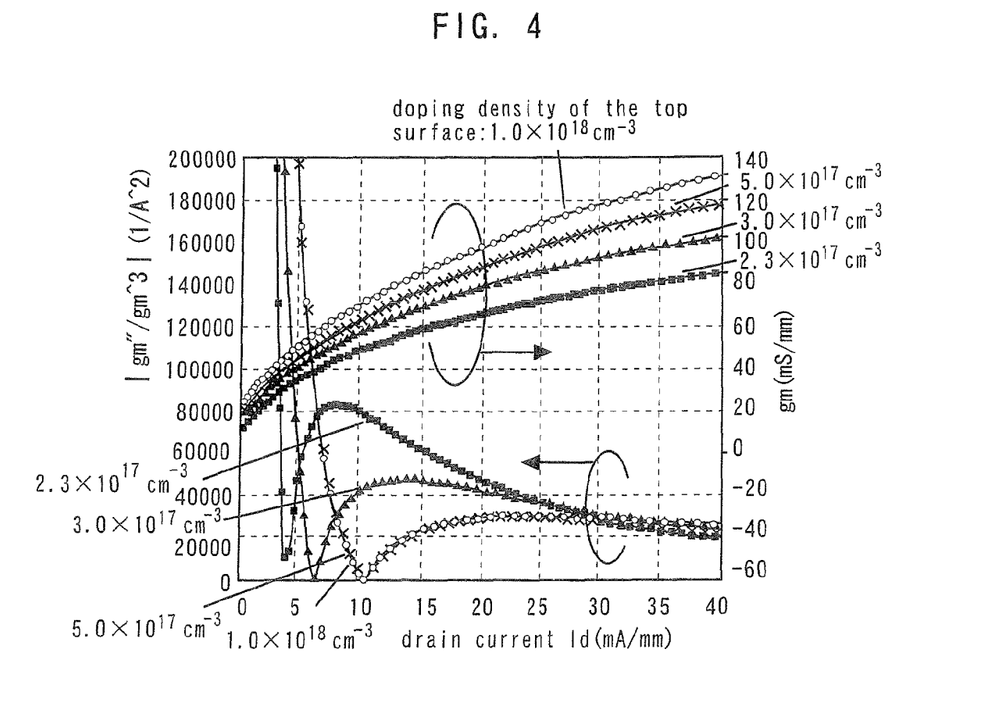
FIG. 4 is a diagram showing measured relationships between the drain current Id and the transconductance gm of a semiconductor device and between the drain current Id and the quantity |gm"/gm$^3$| for different doping densities of the top surface of the channel layer.

FIG. 4 is a diagram showing measured relationships between the drain current Id and the transconductance gm of a semiconductor device and between the drain current Id and the quantity $|gm''/gm^3|$ (where gm" is the second derivative of the transconductance gm with respect to the bias voltage) for different doping densities of the top surface of the channel layer. This semiconductor device has a gate length Lg of 1.1 μm and a gate width Wg of 100 μm. The reason for the results shown in FIG. 3 will be described with reference to FIG. 4.

As shown in FIG. 4, the transconductance gm uniformly increased as the doping density at the top surface of the channel layer increased (and the thickness of the channel layer was reduced accordingly) while maintaining the graded dopant impurity concentration profile described above. On the other hand, since the graded dopant impurity concentration profile described above was adopted, gm" did not increase as gm was increased. As a result, the quantity $|gm''/gm^3|$ uniformly decreased as the dopant impurity concentration in the channel layer increased (and the thickness of channel layer was reduced accordingly).

It should be noted that a Volterra series expansion for determining the third order intermodulation distortion (IMD3) includes the term $|gm''/gm^3|$. Therefore, it may be concluded that the reduction in the quantity $|gm''/gm^3|$ (shown in FIG. 4) resulted in the improved distortion characteristics of the semiconductor device (shown in FIG. 3) when the dopant impurity concentration at the top surface of the channel layer was increased (and the thickness of the channel layer was reduced accordingly) while maintaining the graded dopant impurity concentration profile described above.

It should be noted that the n-type GaAs channel layer 14 may have a stepwise-graded doping profile, instead of the continuously graded doping profile described above, such that the dopant impurity concentration varies substantially inversely with the third power of depth, x, into the channel layer from the top surface of the channel layer (that is, the dopant impurity concentration is substantially inversely proportional to $x^{-3}$), with the same distortion reducing effect.

Second Embodiment

A second embodiment of the present invention provides a semiconductor device in which the channel layer has a graded doping profile such that the dopant impurity concentration varies inversely with the third power of depth into the channel layer from the top surface of the channel layer, as in the semiconductor device of the first embodiment. The gate electrode (21) of this semiconductor device has a gate length Lg of 0.2 μm-0.6 μm. Unlike the first embodiment, the doping impurity concentration at the top surface of the channel layer is not limited to any particular range. The following example assumes that the channel layer has a thickness of 700 Å and its top surface has a doping density of $5.0 \times 10^{17}$ $cm^{-3}$. Except for the features described above, the semiconductor device of the present embodiment is similar to that of the first embodiment. Further, it is manufactured in the same manner as described in connection with the first embodiment.

Figure 5:
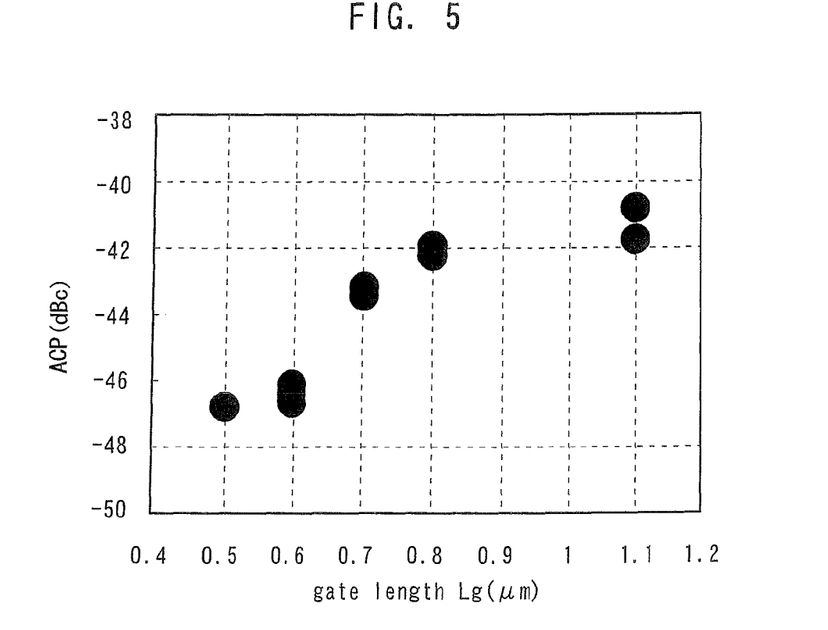
FIG. 5 is a diagram showing a measured relationship between the distortion characteristics of the semiconductor device of the second embodiment and its gate length.

Characteristics of the semiconductor device of the present embodiment will now be described. FIG. 5 is a diagram showing a measured relationship between the distortion characteristics (namely, the adjacent channel power, or ACP) of the semiconductor device of the present embodiment and its gate length.

The gate width Wg of this semiconductor device was 12.6 mm. The gate length Lg was changed from 0.5 μm to 1.1 μm. The device is mounted in a surface mount discrete package. The distortion characteristics of the semiconductor device were measured when a 2.14 GHz W-CDMA modulated signal (3GPP TEST MODEL 1, 64 code single signal, 3.84 MHz channel bandwidth) was input to the device with the drain voltage Vd and the drain current Id set to 10 V and 300 mA. The output power (Pout) of the semiconductor device was 24 dBm.

The measurement results show that as the gate length Lg was reduced, the distortion characteristics of the semiconductor device improved until the gate length Lg reached 0.6 μm, after which the distortion characteristics substantially did not change. That is, the semiconductor device has low distortion characteristics when the gate electrode 21 has a gate length Lg equal to or smaller than 0.6 μm. The gate electrode 21 may have a gate length Lg equal to or larger than 0.2 μm, which allows the electrode to be formed by a common process.

Figure 6:
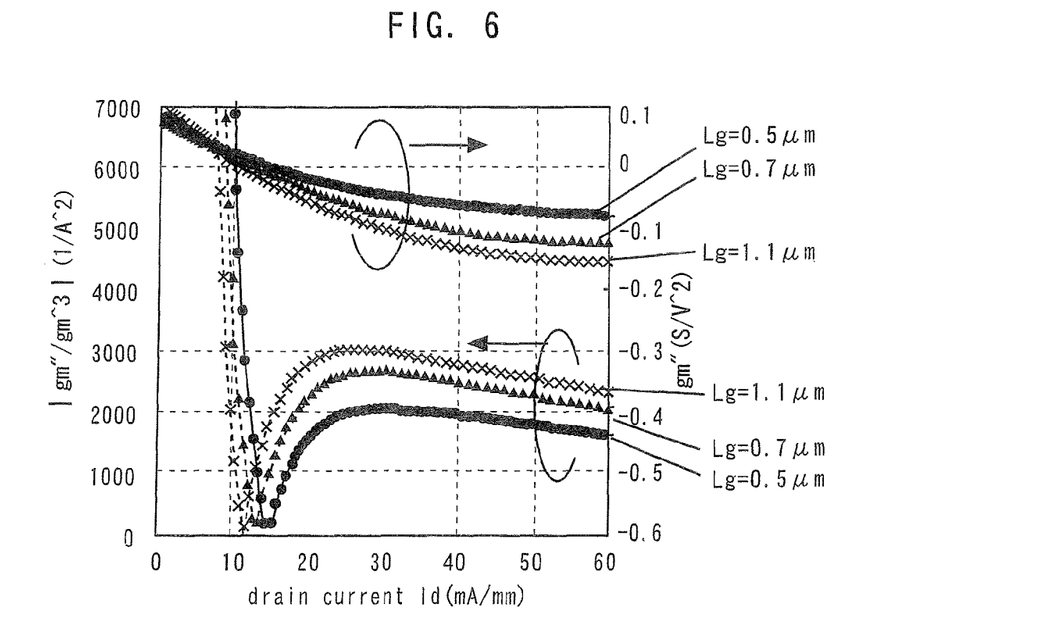
FIG. 6 shows measured relationships between the drain current Id of a semiconductor device and the second derivative gm" of its transconductance and between the drain current Id and the quantity |gm"/gm$^3$| for different gate lengths Lg.

FIG. 6 shows measured relationships between the drain current Id of a semiconductor device and the second derivative gm" of its transconductance gm (with respect to the gate bias) and between the drain current Id and the quantity $|gm''/gm^3|$ for different gate lengths Lg. The gate width Wg of this semiconductor device was 300 μm. The gate length Lg was changed from 0.5 μm to 1.1 μm. The reason for the results shown in FIG. 5 will be described with reference to FIG. 6.

As shown in FIG. 6, as the gate length Lg was reduced, the second derivative gm" of the transconductance of the semiconductor device uniformly decreased and hence the quantity $|gm''/gm^3|$ also uniformly decreased.

As described above, a Volterra series expansion for determining the IMD3 includes the term $|gm''/gm^3|$. Therefore, it may be concluded that the above reduction in the quantity $|gm''/gm^3|$ (shown in FIG. 6) resulted in the improved distortion characteristics of the semiconductor device (shown in FIG. 5) when the gate length Lg was reduced.

The reason for the decrease in the second derivative gm" when the gate length Lg was reduced may be that the pinch-off voltage significantly decreased due to the short-channel effect, which resulted in an change in the gm characteristics such that the second derivative gm" was reduced.

Third Embodiment

Figure 7:
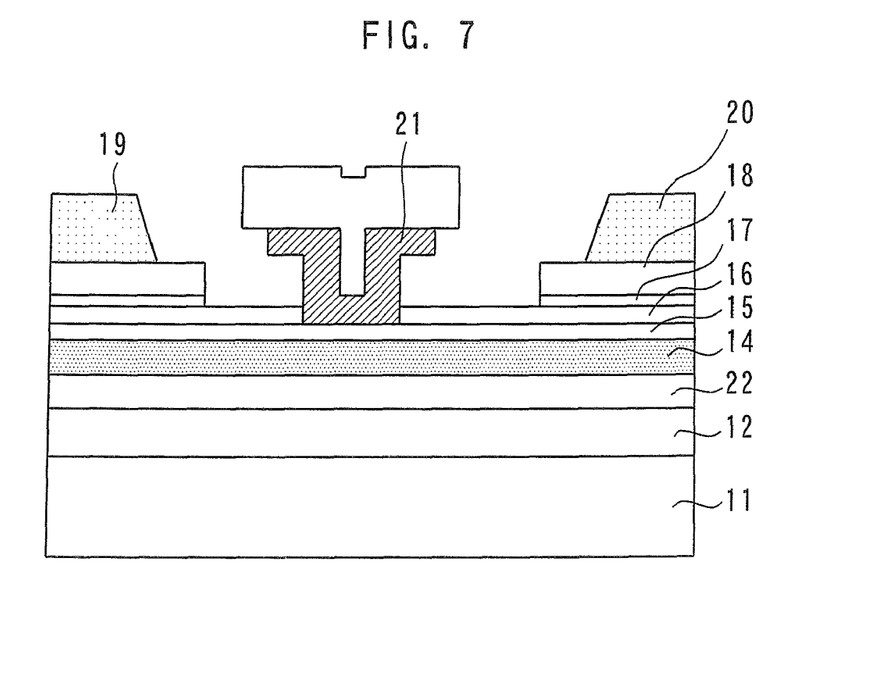
FIG. 7 is a cross-sectional view of a semiconductor device according to a third embodiment of the present invention.

FIG. 7 is a cross-sectional view of a semiconductor device according to a third embodiment of the present invention. This semiconductor device differs from that shown in FIG. 1 in that it includes an undoped $Al_{0.20}Ga_{0.80}As$ buffer layer 22

(referred to simply as a "buffer layer" in the appended claims) instead of the undoped GaAs buffer layer 13 (also referred to as a "buffer layer" in the appended claims). It should be noted that undoped $Al_{0.20}Ga_{0.80}As$, from which the buffer layer 22 is formed, has a lower electron affinity than GaAs, from which the n-type GaAs channel layer 14 (referred to simply as a "channel layer" in the appended claims) is formed. Unlike the first embodiment, the doping density of the top surface of the channel layer is not limited to any particular range. Except for the features described above, the semiconductor device of the present embodiment is similar to that of the first embodiment. Further, the device is manufactured in the same manner as described in connection with the first embodiment.

Figure 8:
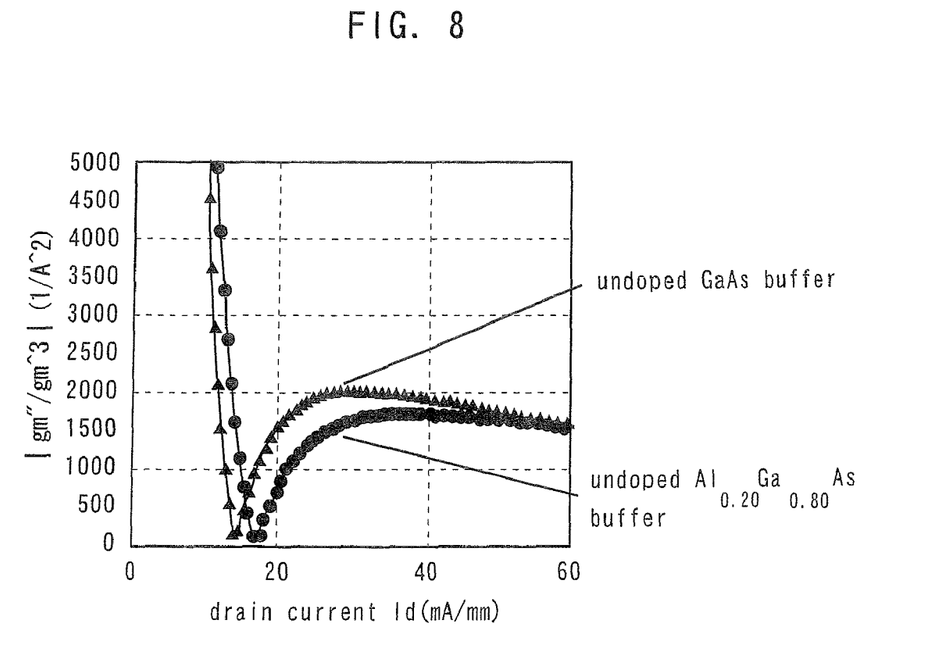
FIG. 8 shows a measured relationship between the drain current Id of each semiconductor device and the quantity |gm"/gm$^3$|.

Characteristics of the semiconductor device of the present embodiment will now be described. FIG. 8 shows characteristics of a semiconductor device having an undoped $Al_{0.20}Ga_{0.80}As$ buffer layer and that having an undoped GaAs buffer. Specifically, FIG. 8 shows a measured relationship between the drain current Id of each semiconductor device and the quantity $|gm''/gm^3|$ (where gm is the transconductance of the device and gm'' is the second derivative of the transconductance gm with respect to the gate bias). These semiconductor devices have a gate length Lg of 0.5 µm and a gate width Wg of 300 µm. The measurement results clearly show that the semiconductor device with the undoped $Al_{0.20}Ga_{0.80}As$ buffer layer has a lower value of the quantity $|gm''/gm^3|$ than the semiconductor device with the undoped GaAs buffer layer when Id≦40 mA/mm. This results from the fact that the transconductance (gm) of the semiconductor device with the undoped $Al_{0.20}Ga_{0.80}As$ buffer layer has a smaller second derivative gm'' (with respect to the gate bias) than the transconductance (gm) of the semiconductor device with the undoped GaAs buffer layer when Id≦40 mA/mm.

The reason for this fact is that since undoped $Al_{0.2}Ga_{0.80}As$ has a lower electron affinity than undoped GaAs, the semiconductor device with the undoped $Al_{0.20}Ga_{0.80}As$ buffer layer 22 has a better dopant impurity concentration profile in the n-type GaAs channel layer 14 than the semiconductor device with the undoped GaAs buffer layer 13 due to the increased electron confinement effect caused by the increased hetero barrier (between the buffer and channel layers). (That is, the channel layer of the semiconductor device with the undoped $Al_{0.20}Ga_{0.80}As$ buffer layer has a doping profile such that the dopant impurity concentration is more nearly inversely proportional to the third power of depth, x, into the channel layer from the surface thereof.)

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2007-131467, filed on May 17, 2007 including specification, claims, drawings and summary, on which the Convention priority of the present application is based, are incorporated herein by reference in its entirety.

What is claimed is:

1. A semiconductor device comprising:
    a compound semiconductor substrate;
    a buffer layer, a channel layer, and a Schottky junction forming layer sequentially laminated on said compound semiconductor substrate, each of said buffer layer, said channel layer, and said Schottky junction forming layer being compound semiconductor materials;
    a source electrode and a drain electrode, each of said source electrode and the drain electrode being disposed on said Schottky junction forming layer; and
    a gate electrode disposed between said source and drain electrodes and forming a Schottky junction with said Schottky junction forming layer, wherein
    said channel layer has a dopant impurity concentration that varies with distance from a top surface of said channel layer and is inversely proportional to the third power of distance into said channel layer from said top surface of said channel layer, and
    said gate electrode has a gate length in a range from 0.2 µm to 0.6 µm.

* * * * *